United States Patent
Saito et al.

(10) Patent No.: US 10,056,374 B2
(45) Date of Patent: Aug. 21, 2018

(54) SWITCHING DEVICE

(71) Applicants: TOYOTA JIDOSHA KABUSHIKI KAISHA, Toyota-shi, Aichi-ken (JP); DENSO CORPORATION, Kariya-shi, Aichi (JP)

(72) Inventors: Jun Saito, Toyota (JP); Yasushi Urakami, Kariya (JP); Sachiko Aoi, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/681,822

(22) Filed: Aug. 21, 2017

(65) Prior Publication Data
US 2018/0102361 A1 Apr. 12, 2018

(30) Foreign Application Priority Data
Oct. 6, 2016 (JP) .................................. 2016-198385

(51) Int. Cl.
| H01L 29/66 | (2006.01) |
| H01L 27/088 | (2006.01) |
| H01L 29/06 | (2006.01) |
| H01L 29/739 | (2006.01) |
| H01L 29/78 | (2006.01) |

(52) U.S. Cl.
CPC ........ *H01L 27/088* (2013.01); *H01L 29/0634* (2013.01); *H01L 29/66734* (2013.01); *H01L 29/7393* (2013.01); *H01L 29/7813* (2013.01)

(58) Field of Classification Search
CPC ............... H01L 27/088; H01L 29/7813; H01L 29/7393
USPC ......................................................... 257/337
See application file for complete search history.

(56) References Cited

U.S. PATENT DOCUMENTS

2010/0224932 A1  9/2010 Takaya et al.

FOREIGN PATENT DOCUMENTS

JP  2007-242852 A  9/2007

*Primary Examiner* — Anthony Ho
(74) *Attorney, Agent, or Firm* — Oliff PLC

(57) ABSTRACT

A switching device may be provided with: a semiconductor substrate; a trench provided in an upper surface of the semiconductor substrate; a gate insulating layer covering an inner surface of the trench; and a gate electrode located in the trench. The semiconductor substrate includes: a first semiconductor region being in contact with the gate insulating layer; a body region being in contact with the gate insulating layer under the first semiconductor region; a second semiconductor region being in contact with the gate insulating layer under the body region; a bottom region being in contact with the gate insulating layer at a bottom surface of the trench; and a connection region being in contact with the gate insulating layer at a lateral surface of the trench and connecting the body region and the bottom region. The connection region is thicker than the bottom region.

4 Claims, 7 Drawing Sheets

SWITCHING DEVICE

TECHNICAL FIELD

An art disclosed herein relates to a switching device.

DESCRIPTION OF RELATED ART

Japanese Patent Application Publication No. 2007-242852 discloses a trench-type switching device. Trenches are provided in an upper surface of a semiconductor substrate. A gate insulating layer and a gate electrode are disposed in each trench. The semiconductor substrate includes n-type source regions, a p-type body region, and an n-type drift region. The source regions are in contact with the gate insulating layers. The body region is in contact with the gate insulating layers under the source regions. The drift region is in contact with the gate insulating layers under the body region. Further, the semiconductor substrate includes p-type bottom regions in contact with the gate insulating layers at bottom surfaces of the trenches and p-type connection regions in contact with the gate insulating layers at lateral surfaces of the trenches. Each connection region connects the body region and the corresponding bottom region. The drift region is in contact with the gate insulating layers in a range where the connection regions do not exist.

SUMMARY

In a switching device provided with a connection region as in Japanese Patent Application Publication No. 2007-242852, an impurity concentration of the connection region can be adjusted such that a depletion layer spreads in the connection region in an off state. When this type of switching device turns off, a depletion layer extends from a body region into a drift region. The depletion layer extending from the body region to the drift region alleviates electric field concentration in a semiconductor substrate. Further, a depletion layer also extends from a bottom region to the drift region. The depletion layer extending from the bottom region to the drift region suppresses electric field concentration in vicinity of a trench. In the course of the depletion layer extending to the drift region, the depletion layer also extends to the connection region. The depletion layer extending to the connection region electrically separates the bottom region from the body region, and makes a potential of the bottom region floating. Due to this, a high potential difference is prevented from being generated between the bottom region and the drift region.

Further, when this kind of switching device turns on, a channel is formed in the body region, and the depletion layer that had spread in the drift region shrinks, which brings the switching device to an on state. During its course, the depletion layer in the connection region shrinks and the bottom region is electrically connected to the body region via the connection region. Then, the bottom region takes substantially a same potential as the body region, and the depletion layer that had spread from the bottom region to the drift region shrinks toward the bottom region. Due to this, a resistance of the drift region drops promptly when the switching device turns on. Therefore, this type of switching device generates small loss.

The present inventors discovered a problem that electric field concentration occurs in the connection region as described below. FIG. 8 illustrates a cross sectional view of a switching device according to a conventional example. It should be noted that in FIG. 8, a dashed line indicates an end of a depletion layer when the switching device is off. In FIG. 8, a semiconductor region marked by a dotted pattern is a region not depleted (referred to as "undepleted region" hereinbelow), and a semiconductor region not marked by the dotted pattern is a region in which the depletion layer has spread. The depletion layer extends from a pn junction at an interface between p-type regions (a bottom region 200, a connection region 210, and a body region 220) and an n-type region (a drift region 230). The bottom region 200 is depleted in vicinity of the pn junction. The undepleted region remains within the bottom region 200 in vicinity of a bottom surface of a trench. The connection region 210 is depleted entirely in its thickness direction at a position near the bottom region 200. The undepleted region remains within the connection region 210 at a position near the body region 220. In the switching device shown in FIG. 8, a thickness Tb of the bottom region 200 is thicker than a thickness Tc of the connection region 210. Due to this, a curvature of a lower end portion 210a of the undepleted region within the connection region 210 is greater than a curvature of an end portion 200a of the undepleted region within the bottom region 200 (that is, the lower end portion 210a curves more steeply). Due to this, higher electric field is generated in vicinity of the lower end portion 210a than in vicinity of the end portion 200a. Thus, in a conventional switching device, since higher electric field is generated at a connection region than at a bottom region, the electric field generated at the connection region limits a withstanding voltage of the switching device. It should be noted that, although an n-channel type switching device is described in the above explanation, a similar problem occurs in a p-channel type switching device as well.

A switching device may comprise: a semiconductor substrate; a trench provided in an upper surface of the semiconductor substrate; a gate insulating layer covering an inner surface of the trench; and a gate electrode located in the trench and insulated from the semiconductor substrate by the gate insulating layer. The semiconductor substrate may comprise: a first semiconductor region of a first conductivity type being in contact with the gate insulating layer; a body region of a second conductivity type being in contact with the gate insulating layer under the first semiconductor region; a second semiconductor region of the first conductivity type being in contact with the gate insulating layer under the body region and separated from the first semiconductor region by the body region; a bottom region of the second conductivity type being in contact with the gate insulating layer at a bottom surface of the trench; and a connection region of the second conductivity type being in contact with the gate insulating layer at a lateral surface of the trench and connecting the body region and the bottom region. A thickness of the connection region is thicker than a thickness of the bottom region.

It should be noted that one of the first conductivity type or the second conductivity type is an n-type, and the other is a p-type. Further, in the present teachings, the thickness of the connection region is a dimension thereof in a vertical direction to the lateral surface of a part of the trench where the connection region is situated. Similarly, in the present teachings, the thickness of the bottom region is a dimension thereof in a vertical direction to the bottom surface of a part of the trench where the bottom region is situated.

In the switching device disclosed herein, the thickness of the connection region is thicker than the thickness of the bottom region. Therefore, a curvature of an end of the undepleted region remaining in the connection region when the switching device is off is smaller than a curvature of an end of the undepleted region remaining in the bottom region. Due to this, when the switching device is off, electric field generated in the connection region is smaller than electric field generated in the bottom region. Therefore, according to this configuration, a withstanding voltage of a switching device can be improved without allowing the withstanding voltage to be limited by the electric field generated within the connection region.

DETAILED DESCRIPTION

Embodiments

Figure 1:
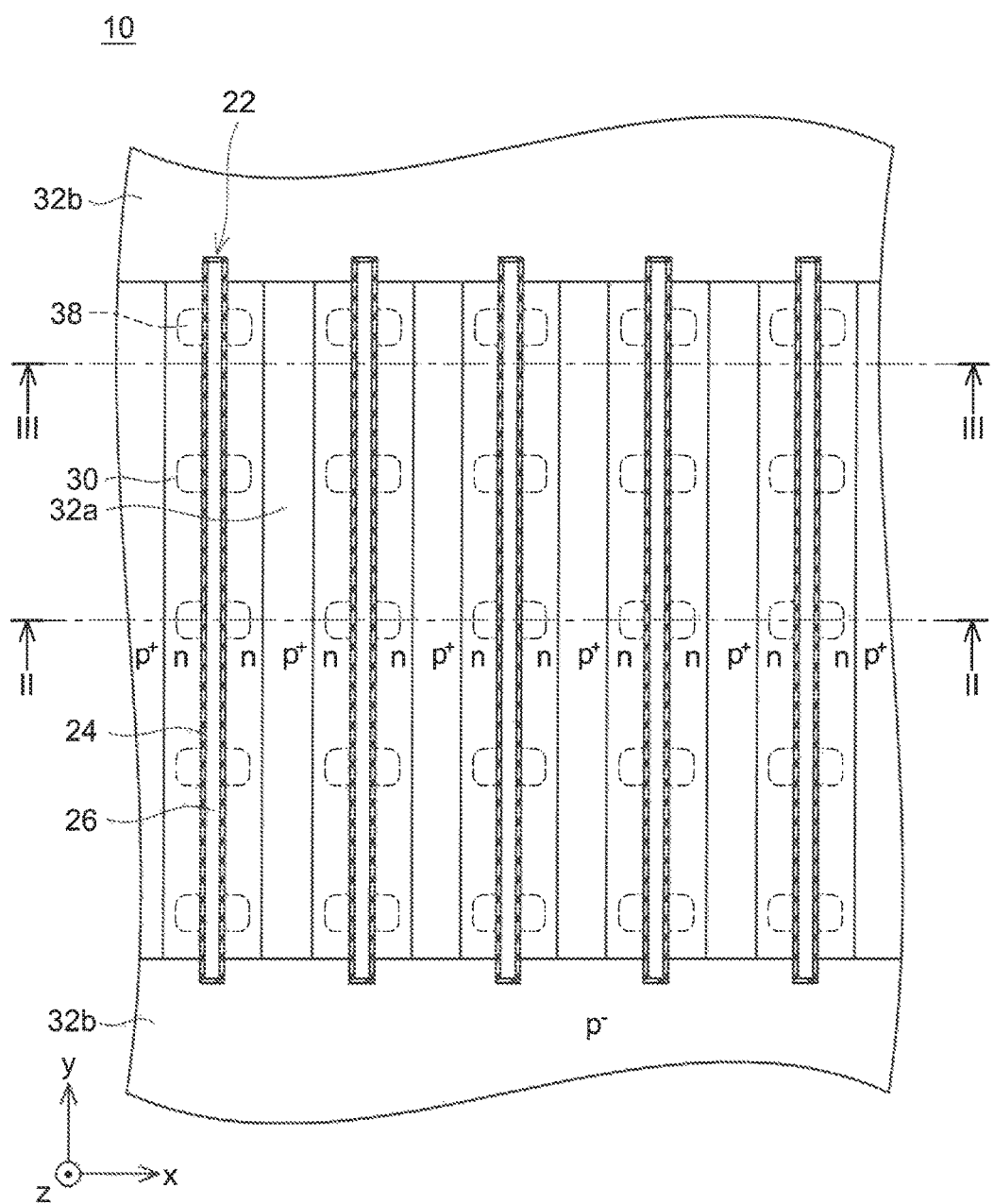
FIG. 1 illustrates a plan view of a switching device according to an embodiment as seen from an upper surface side of the switching device.
Figure 2:
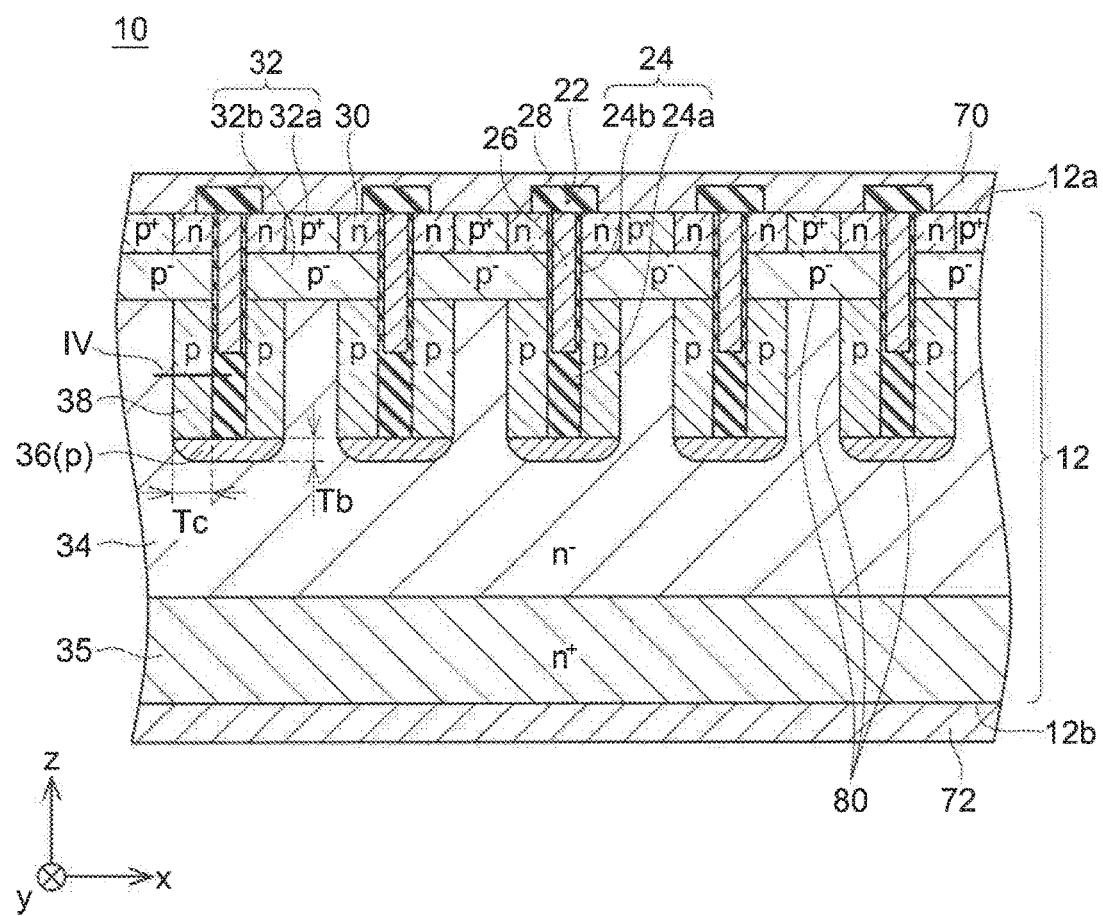
FIG. 2 illustrates a cross sectional view of the switching device taken along a line II-II of FIG. 1.
Figure 3:
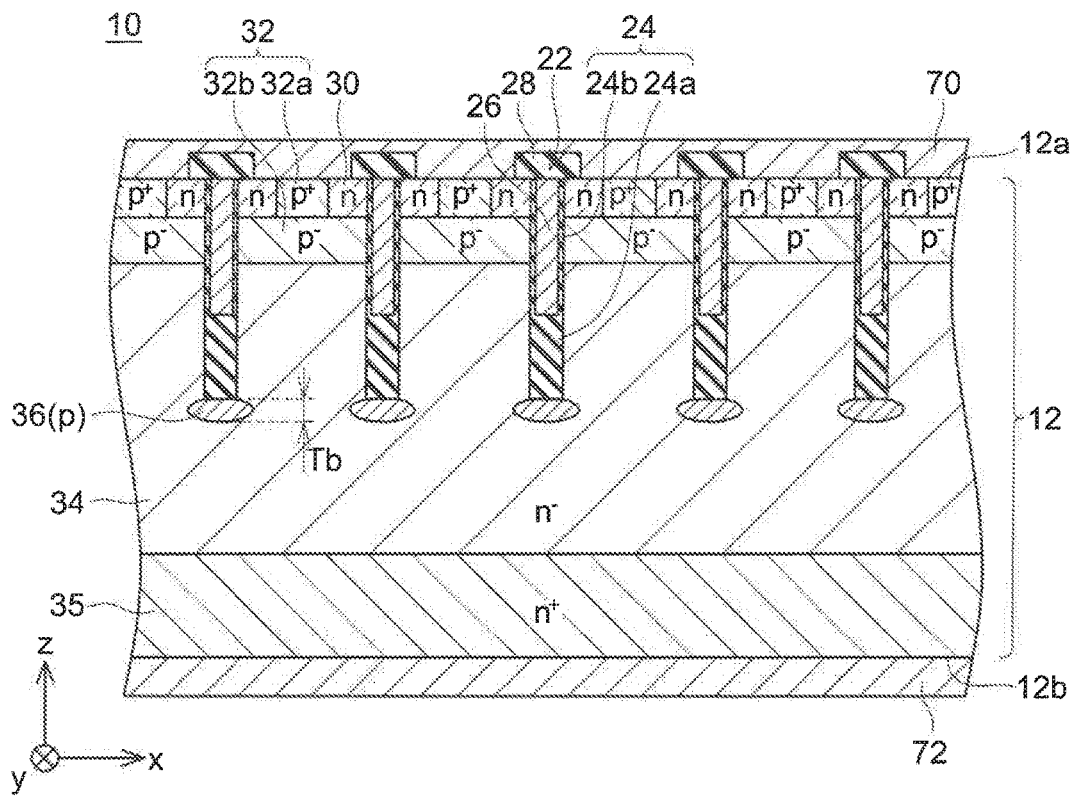
FIG. 3 illustrates a cross sectional view of c switching device taken along a line III-III of FIG. 1.

A switching device according to an embodiment shown in FIGS. 1 to 3 is a MOSFET (Metal-Oxide-Semiconductor Field-Effect Transistor). The switching device 10 comprises a semiconductor substrate 12, electrodes, and insulating layers, etc. It should be noted that in FIG. 1, illustration of the electrode and the insulating layers on an upper surface 12a of the semiconductor substrate 12 is omitted for the sake of visibility. Hereinbelow, one of directions parallel to the upper surface 12a of the semiconductor substrate 12 will be denoted as an x direction, a direction parallel to the upper surface 12a and orthogonal to the x direction will be denoted as a y direction, and a thickness direction of the semiconductor substrate 12 will be denoted as a z direction. The semiconductor substrate 12 is a SiC substrate containing SIC (silicon carbide) as a main material thereof.

A plurality of trenches 22 is provided in the upper surface 12a of the semiconductor substrate 12. As shown in FIG. 1, each trench 22 extends linearly and long in the y direction at the upper surface 12a. The trenches 22 are aligned at intervals in the x direction.

As shown in FIGS. 2 and 3, an inner surface of each trench 22 is covered with a gate insulating layer 24. Each gate insulating layer 24 includes a bottom insulating layer 24a and a lateral surface insulating film 24b. Each bottom insulating layer 24a is provided at a bottom of the corresponding trench 22. Each bottom insulating layer 24a covers a bottom surface of the corresponding trench 22 and a lateral surface of the corresponding trench 22 near the bottom surface. Each lateral insulating film 24b covers the lateral surface of the corresponding trench 22 situated upper than the corresponding bottom insulating layer 24a, A thickness of each bottom insulating layer 24a (i.e., width between an upper surface and a lower surface of the bottom insulating layer 24a) is thicker than a thickness of each lateral surface insulating film 24b (i.e., interval between the lateral surface of the corresponding trench 22 and a lateral surface of a corresponding gate electrode 26). The gate electrode 26 is disposed in each trench 22. Each gate electrode 26 is insulated from the semiconductor substrate 12 by the corresponding gate insulating layer 24. An upper surface of each gate electrode 26 is covered with an interlayer insulating film 28.

As shown in FIGS. 2 and 3, an upper electrode 70 is arranged on the upper surface 12a of the semiconductor substrate 12. The upper electrode 70 is in contact with the upper surface 12a of the semiconductor substrate 12 at positions where the interlayer insulating film 28 is not provided. The upper electrode 70 is insulated from the respective gate electrodes 26 by the corresponding interlayer insulating films 28. A lower electrode 72 is arranged on a lower surface 12b of the semiconductor substrate 12. The lower electrode 72 is in contact with the lower surface 12b of the semiconductor substrate 12.

As shown in FIGS. 1 to 3, a plurality of source regions 30, a body region 32, a drift region 34, a drain region 35, a plurality of bottom regions 36, and a plurality of connection regions 38 are provided in the semiconductor substrate 12.

Each source region 30 is an n-type region. As shown in FIGS. 2 and 3, each source region 30 is arranged in a range located at the upper surface 12a of the semiconductor substrate 12, and makes ohmic contact with the upper electrode 70. The lateral surface of each trench 22 includes transverse end lateral surfaces located at ends in a transverse direction of the trench 22 and extending along the y direction. Each source region 30 is in contact with its corresponding lateral surface insulating film 24b at the transverse end lateral surfaces of the corresponding trench 22. Each source region 30 is in contact with the corresponding lateral surface insulating film 24b at an upper end portion of the corresponding trench 22.

The body region 32 is a p-type region. As shown in FIGS. 2 and 3, the body region 32 is in contact with the respective source regions 30. The body region 32 extends from ranges sandwiched by pairs of the two source regions 30 to lower sides of the source regions 30. The body region 32 comprises high concentration regions 32a and a low concentration region 32b. The high concentration regions 32a have a p-type impurity concentration higher than the low concentration region 32b. Each high concentration region 32a is arranged in the range between the corresponding pair of the two source regions 30. The high concentration regions 32a make an ohmic contact with the upper electrode 70. The low concentration region 32b is in contact with the lateral surface insulating films 24b at the transverse end lateral surfaces of the trenches 22. The low concentration region 32b is in contact with the lateral surface insulating films 24b under the source regions 30. A lower end of the body region 32 (i.e., lower end of the low concentration region 32b) is positioned higher than a lower end of each gate electrode 26 (i.e., upper surface of each bottom insulating layer 24a). The lateral surface of each trench 22 includes longitudinal end lateral surfaces located at ends in a longitudinal direction of the trench 22 and extending along the x direction. As shown in FIG. 1, the low concentration region 32b is also arranged in regions adjoining the longitudinal end lateral surfaces of the trenches 22.

The drift region 34 is an n-type region. As shown in FIGS. 2 and 3, the drift region 34 is arranged below the body region 32 and separated from the source regions 30 by the body region 32. As shown in FIG. 3, the drift region 34 is in contact with the lateral surface insulating films 24b and the bottom insulating layers 24a in a range where the connection regions 38 are not arranged. The drift region 34 is in contact with the lateral surface insulating films 24b and the bottom insulating layers 24a under the body region 32.

The drain region 35 is an n-type region. The drain region 35 has an n-type impurity concentration higher than that of the drift region 34. As shown in FIGS. 2 and 3, the drain region 35 is arranged under the drift region 34. The drain region 35 is arranged in a range located at the lower surface 12b of the semiconductor substrate 12. The drain region 35 makes an ohmic contact with the lower electrode 72.

Each bottom region 36 is a p-type region. As shown in FIGS. 2 and 3, each bottom region 36 is arranged in a range located at the bottom surface of the corresponding trench 22. Each bottom region 36 is in contact with the corresponding bottom insulating layer 24a at the bottom surface of the corresponding trench 22. Each bottom region 36 extends long in the y direction along the bottom surface of the corresponding trench 22. Each bottom region 36 is in contact with the corresponding bottom insulating layer 24a over an entirety of the bottom surface of the corresponding trench 22. Each bottom region 36 is surrounded by the drift region 34. Except for spots where the connection regions 38 to be described later are arranged, each bottom region 36 is separated from the body region 32 by the drift region 34.

The connection regions 38 comprises pairs of connection regions 38 opposed to each other via a corresponding trench 22. Each connection region 38 is a p-type region. As shown in FIG. 1, each pair of connection regions 38 is arranged so as to be in contact with a part of the transverse end lateral surfaces of the corresponding trench 22. The pairs of connection regions 38 are arranged in plurality on the transverse end lateral surfaces of each trench 22. As shown in FIG. 2, each connection region 38 extends from the body region 32 downward along one of the transverse end lateral surfaces of the corresponding trench 22. A lower end of each connection region 38 is connected to the corresponding bottom region 36. That is, each pair of connection regions 38 connects the body region 32 and the corresponding bottom region 36.

Figure 4:
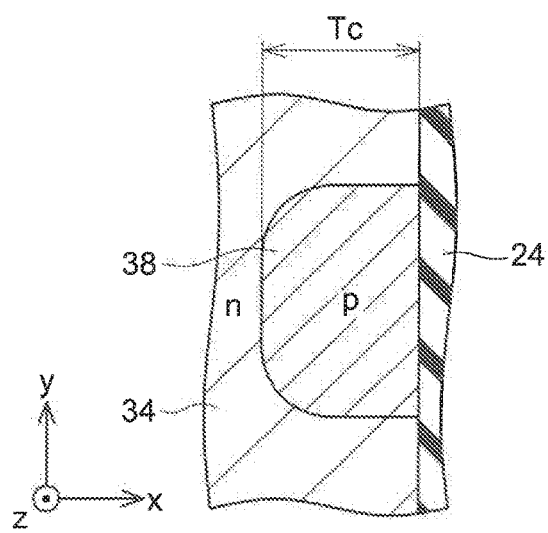
FIG. 4 illustrates a cross sectional view of a connection region 38 taken along a line IV of FIG. 2.

A thickness Tc of each connection region 38 is a dimension thereof in a vertical direction to the lateral surface of the corresponding trench 22 on which the corresponding connection region 38 is provided (i.e., the x direction in the present embodiment). It should be noted that, strictly speaking, the dimension in the x direction of each connection region 38 is not constant in a xy plane as shown in FIG. 4. In this case, a largest value in the x direction dimension of each connection region 38 in the xy plane will be referred to as the thickness Tc of the connection region 38. Further, a thickness Tb of each bottom region 36 is a dimension thereof in a vertical direction to the bottom surface of the corresponding trench 22 (i.e., the y direction in the present embodiment). It should be noted that a dimension in the z direction of each bottom region 36 is not constant. In this case, a largest value of the z direction dimension of each bottom region 36 will be referred to as the thickness Tb of the bottom region 36. The thickness Tc of each connection region 38 is thicker than the thickness Tb of each bottom region 36. It should be noted that the thickness Tc of each connection region 38 is substantially constant in an entire range from the body region 32 to the corresponding bottom region 36. That is, each connection region 38 has a greater thickness than the thickness Tb of each bottom region 36 in the entire range from the body region 32 to the corresponding bottom region 36.

Next, an operation of the switching device 10 will be described. When the switching device 10 operates, the switching device 10, a load (e.g., a motor), and a power source are connected in series. A supply voltage (approximately 800V in the present embodiment) is applied to the series circuit between the switching device 10 and the load. The supply voltage is applied in an orientation by which a drain side (lower electrode 72) of the switching device 10 comes to have a higher potential than a source side (upper electrode 70) thereof. When a gate-on potential (potential higher than a gate threshold) is applied to the gate electrodes 26, a channel (inversion layer) is formed in the body region 32 in a range in contact with the respective lateral surface insulating films 24b (i.e., low concentration region 32b) and the switching device 10 turns on. When a gate-off potential (potential equal to or lower than the gate threshold) is applied to the gate electrodes 26, the channel disappears and the switching device 10 turns off. The operation of the switching device 10 will be described hereinbelow in detail.

Figure 5:
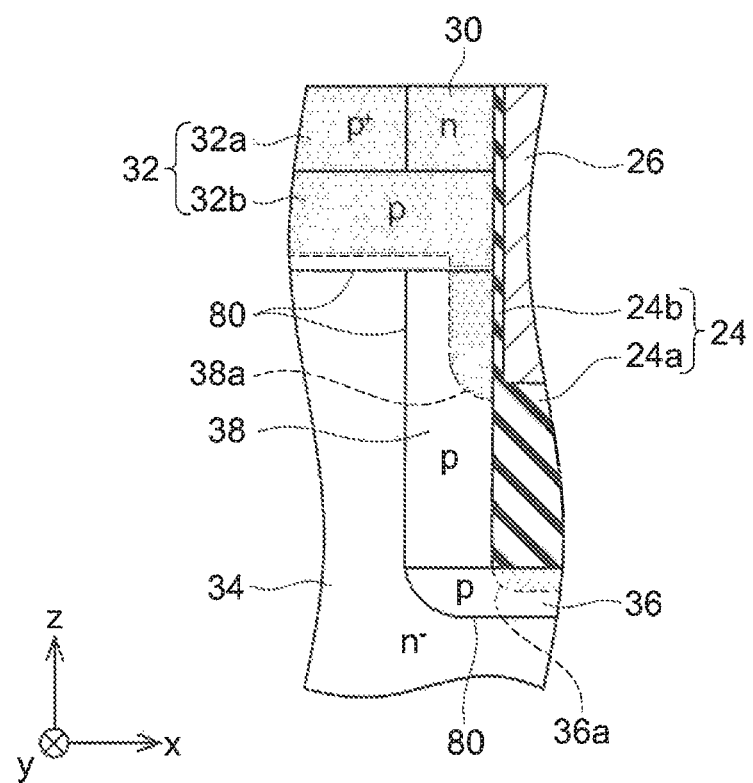
FIG. 5 illustrates a cross sectional view of the switching device according to the embodiment, showing a distribution of depletion layers when the switching device is off.

When the switching device 10 is to be turned off, the potential of the gate electrodes 26 is lowered from the gate-on potential to the gate-off potential. Then the channels disappear, and a potential of the lower electrode 72 rises. As shown in FIG. 2, each bottom region 36 is connected to the body region 32 via the corresponding pair of connection regions 38 such that each bottom region 36 has substantially a same potential as the body region 32 (i.e., substantially a same potential as the upper electrode 70). In a course of the potential of the lower electrode 72 rising, potentials of the drain region 35 and the drift region 34 rise. When the potential of the drift region 34 has risen, a reverse voltage is applied to a pn junction 80 between the drift region 34 and p-type regions constituted of the body region 32, the connection regions 38, and the bottom regions 36. Due to this, as shown in FIG. 5, a depletion layer spreads from the pn junction 80 to its surroundings. It should be noted that, in FIG. 5, a semiconductor region marked by a dotted pattern represents an undepleted region, and a semiconductor region not marked by the dotted pattern represents a region where the depletion layer has spread. As shown in FIG. 5, the depletion layer spreads substantially over an entirety of the drift region 34. Due to this, the switching device 10 turns off. Especially because the depletion layer spreads from each bottom region 36 to the drift region 34, the concentration of electric field in vicinity of the gate insulating layers 24 is suppressed. In each bottom region 36, the depletion layer spreads in vicinity of the pn junction 80 and the undepleted region remains in vicinity of the corresponding gate insulating layer 24. At a lower part of each connection region 38 (a part of the connection region 38 that is in vicinity of the corresponding bottom region 36), the depletion layer spreads entirely in its thickness direction. At an upper part of each bottom region 38 (a part of the connection region 38 that is in vicinity of the body region 32), a part thereof in vicinity of the pn junction 80 is depleted and the undepleted region remains in vicinity of the corresponding gate insulating layer 24. Because the potential in the drift region 34 is distributed such that the potential becomes lower on an upper side thereof (closer side to the body region 32), the undepleted region remains in the upper part of each connection region 38. When the lower part of each connection region 38 has been depleted entirely in its thickness direction, the corresponding bottom region 36 is electrically separated from the body region 32. As a result of this, a potential of the bottom regions 36 becomes floating. Due to this, a potential difference between the bottom regions 36 and the drift region 34 is prevented from becoming excessively large.

When the switching device 10 is to be turned on, the potential of the gate electrodes 26 is raised from the gate-off potential to the gate-on potential. Then, channels are formed in the body region 32 in ranges in contact with the respective gate insulating layers 24. The channels connect the source regions 30 and the drift region 34 in a range shown in FIG. 3. The potential of the drift region 34 in turn drops, and the depletion layer extending from the body region 32 to the drift region 34 shrinks. Due to this, electrons flow from the upper electrode 70 through the source regions 30, the channels, the drift region 34, and the drain region 35 to the lower electrode 72. Further, in a course of the potential drop in the drift region 34, the depletion layer that had spread in each connection region 38 shrinks toward the pn junction 80 and substantially an entirety of each connection region 38 becomes the undepleted region. Each connection region 38 in turn electrically connects the corresponding bottom region 36 and the body region 32, and the bottom regions 36 and the body region 32 take substantially a same potential as each other. Due to this, the depletion layers that had spread from the respective bottom regions 36 to the drift region 34 shrink toward the pa junction 80. Therefore, a resistance of the drift region 34 drops, and it becomes easy for the electrons to flow from the upper electrode 70 toward the lower electrode 72. Due to this, an amount of loss generated in the drift region 34 is suppressed.

Next, an electric field distribution in a state where the switching device 10 is off will be described. While the switching device 10 is off, electric field is generated in the semiconductor regions that are depleted. The electric field is prone to concentrating on inside of the depletion layer in vicinity of an end of the undepleted region. Especially, the electric field concentrates in vicinity of a part of the undepleted region of which end has a great curvature. As mentioned above, in the switching device 10, the thickness Tc of each connection region 38 is thicker than the thickness Tb of each bottom region 36. Due to this, in the state where the switching device 10 is off, as shown in FIG. 5, a curvature of a lower end portion 38a of the undepleted region within each connection region 38 is smaller than a curvature of an end portion 36a (end in a lateral direction thereof) of the undepleted region within each bottom region 36. Due to this, electric field generated in vicinity of each lower end portion 38a is smaller than electric field generated in vicinity of each end portion 36a. In other words, the electric field generated within the connection regions 38 can be suppressed to a lower value than the electric field generated within the bottom regions 36. Therefore, this switching device allows for improved withstanding voltage without being limited by the electric field generated in the connection regions 38. According to the structure of the switching device 10 according to the present embodiment, a higher withstanding voltage than those of conventional switching devices can be realized.

Figure 6:
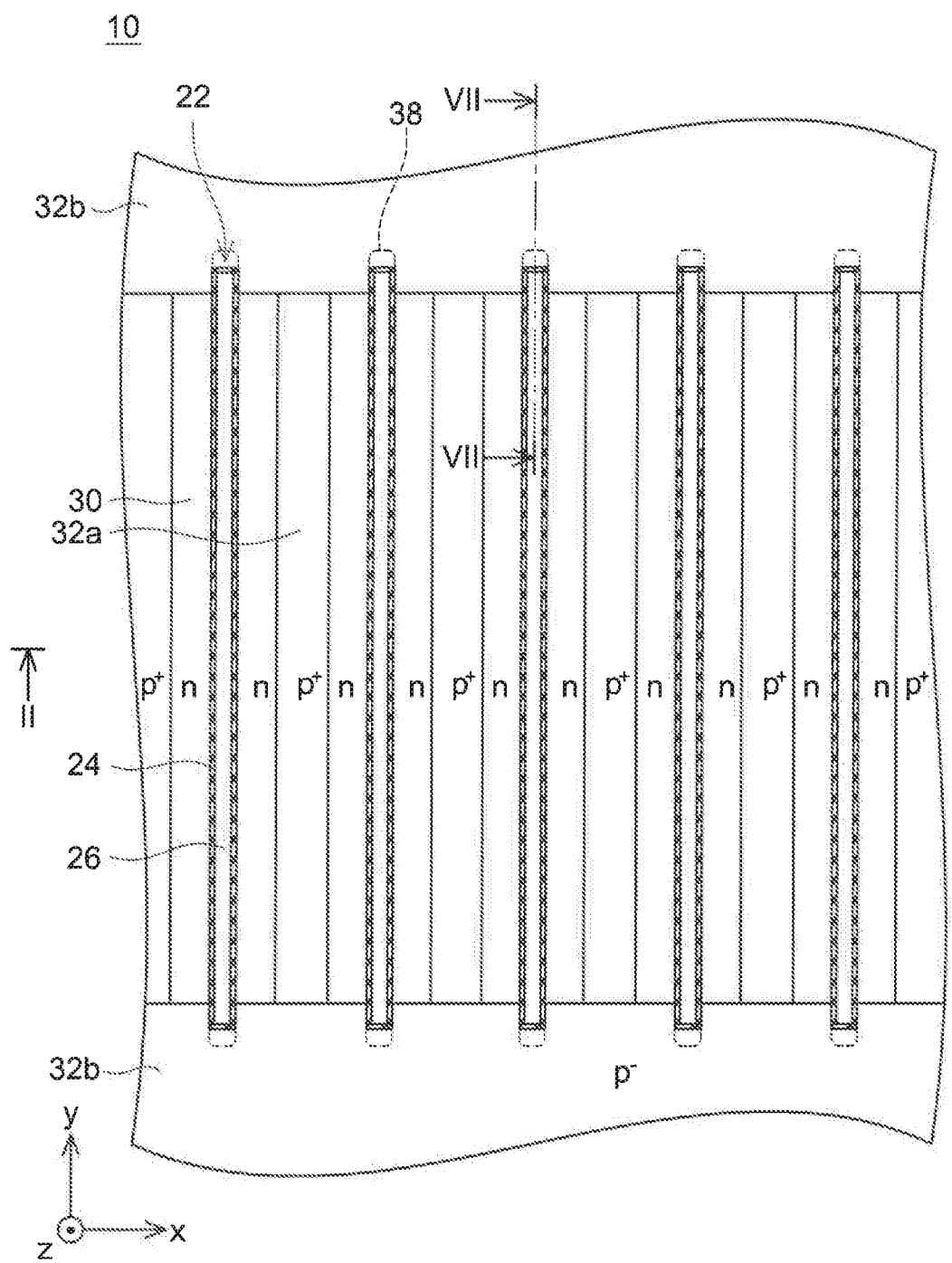
FIG. 6 illustrates a plan view of a switching device according to a variant as seen from an upper surface side of the switching device.
Figure 7:
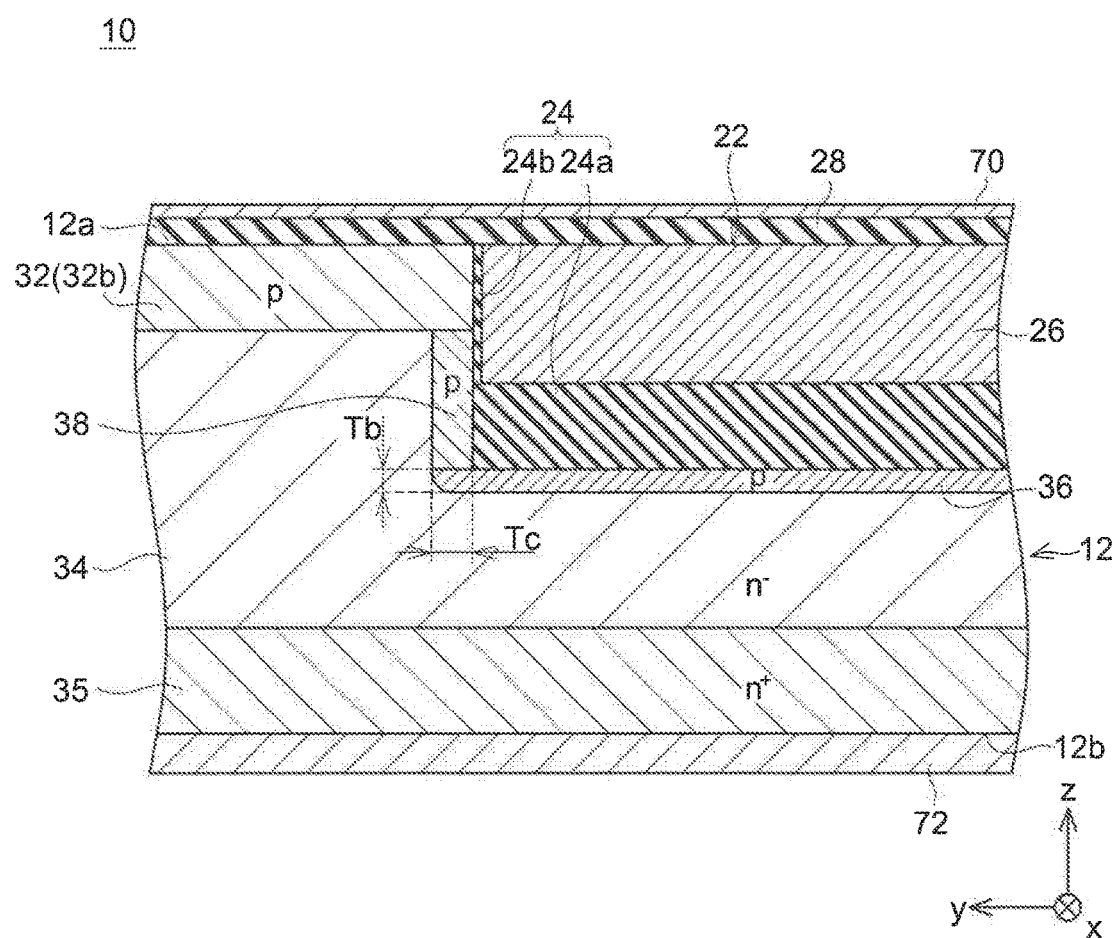
FIG. 7 illustrates a cross sectional view of the switching device taken along a line of FIG. 6.
Figure 8:
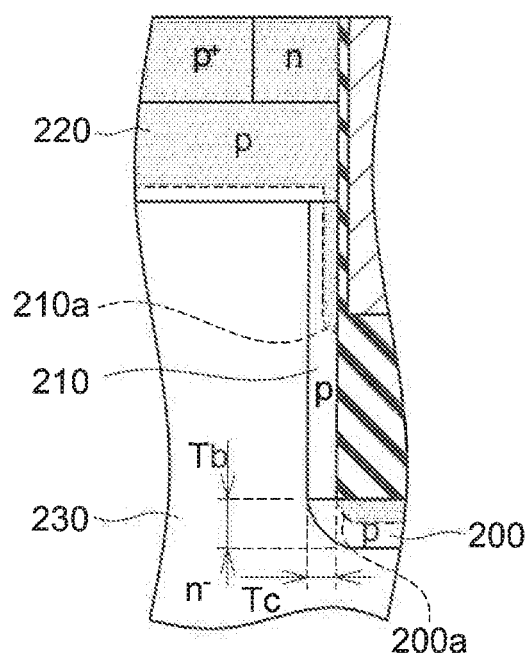
FIG. 8 illustrates a cross sectional view of a conventional switching device, indicating a distribution of depletion layers when the conventional switching device is off.

It should be noted that, in the above embodiment, the connection regions 38 are arranged on the transverse end lateral surfaces of the trenches 22. However, as shown in FIGS. 6 and 7, each connection region 38 may be arranged on the longitudinal end lateral surfaces of the corresponding trench 22 (on respective lateral surfaces arranged at ends in the longitudinal direction of the corresponding trench 22, and extending along the x direction). That is, each connection region 38 may be in contact with its corresponding insulating layer 24 at the longitudinal end lateral surfaces of the corresponding trench 22. In this case, each connection region 38 may be in contact with its corresponding gate insulating layer 24 over entireties of the longitudinal end lateral surfaces of the corresponding trench 22. In this structure also, by making the thickness Tc of each connection region 38 thicker than the thickness Tb of each connection region 36 as shown in FIG. 7, the electric field concentration in the connection regions 38 can be suppressed. Further, by combining the configurations of FIG. 1 and FIG. 6, the respective connection regions 38 may be arranged on both the longitudinal end lateral surfaces and the transverse end lateral surfaces of the trenches 22.

Further, in the above-mentioned embodiments, an n-channel type MOSFET is explained, but alternatively, the art disclosed herein may be applied to a p-channel type MOSFET. The p-channel type MOSFET can be obtained by inverting the p-type and the n-type of each semiconductor region of the above-mentioned embodiments. Further, the art disclosed herein may be applied to an IGBT (Insulated Gate Bipolar Transistor). The IGBT can be obtained by replacing the drain region 35 with a p-type collector region.

Further, in the above embodiments, the thickness of each connection region 38 is substantially constant in the z direction, but alternatively, the thickness of each connection region 38 may vary in the z direction. Further, in the above embodiments, the thickness of each bottom region 36 is substantially constant in the y direction (longitudinal direction of the trenches 22), but alternatively, the thickness of each bottom region 36 may vary in the y direction. In this case, no matter where the thickness of each connection region 38 is measured along the z direction, the thickness of each connection region 38 can be made thicker than the thickness of any part of each bottom region 36 in the y direction.

Correspondence relationships between constituent features of the above embodiments and constituent features of the claims will be described. The source regions 30 of the embodiments are each an example of a first semiconductor region in the claims. The drift region 34 of the embodiments is an example of a second semiconductor region in the claims.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:
1. A switching device, comprising:
    a semiconductor substrate;
    a trench provided in an upper surface of the semiconductor substrate;
    a gate insulating layer covering an inner surface of the trench; and
    a gate electrode located in the trench and insulated from the semiconductor substrate by the gate insulating layer, wherein the semiconductor substrate comprises:

a first semiconductor region of a first conductivity type being in contact with the gate insulating layer;

a body region of a second conductivity type being in contact with the gate insulating layer under the first semiconductor region;

a second semiconductor region of the first conductivity type being in contact with the gate insulating layer under the body region and separated from the first semiconductor region by the body region;

a bottom region of the second conductivity type being in contact with the gate insulating layer at a bottom surface of the trench; and a connection region of the second conductivity type being in contact with the gate insulating layer at a lateral surface of the trench and connecting the body region and the bottom region, and a thickness of the connection region is thicker than a thickness of the bottom region.

2. The switching device of claim 1, wherein the bottom region is in contact with the gate insulating layer over an entirety of the bottom surface of the trench.

3. The switching device of claim 1, wherein the lateral surface of the trench includes transverse end lateral surfaces located at ends in a transverse direction of the trench, and the connection region is in contact with the gate insulating layer at a part of each of the transverse end lateral surfaces of the trench.

4. The switching device of claim 1, wherein the lateral surface of the trench includes longitudinal end lateral surfaces located at ends in a longitudinal direction of the trench, and the connection region is in contact with the gate insulating layer over entireties of the longitudinal end lateral surfaces of the trench.

* * * * *